United States Patent
Lee et al.

(10) Patent No.: US 7,705,364 B2
(45) Date of Patent: Apr. 27, 2010

(54) NITRIDE SEMICONDUCTOR LIGHT EMITTING DEVICE

(75) Inventors: Dong Yul Lee, Kyungki-do (KR); Sang Won Kang, Kyungki-do (KR); Keun Man Song, Seoul (KR); Je Won Kim, Kyungki-do (KR); Sang Su Hong, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 218 days.

(21) Appl. No.: 11/584,504

(22) Filed: Oct. 23, 2006

(65) Prior Publication Data

US 2007/0090339 A1   Apr. 26, 2007

(30) Foreign Application Priority Data

Oct. 25, 2005   (KR) ...................... 10-2005-0100782

(51) Int. Cl.
*H01L 33/00* (2006.01)

(52) U.S. Cl. .............................. 257/96; 257/13; 257/14; 257/94; 257/104; 257/E33.005; 257/E33.008

(58) Field of Classification Search .................. 257/94, 257/96–97, 79, 88–90, 14, 103, 13, 104
See application file for complete search history.

(56) References Cited

U.S. PATENT DOCUMENTS

| 6,153,894 | A | * | 11/2000 | Udagawa | 257/96 |
|---|---|---|---|---|---|
| 6,163,038 | A | * | 12/2000 | Chen et al. | 257/103 |
| 6,608,330 | B1 | * | 8/2003 | Yamada | 257/90 |
| 6,844,572 | B2 | * | 1/2005 | Sawaki et al. | 257/94 |
| 2004/0056258 | A1 | * | 3/2004 | Tadatomo et al. | 257/79 |
| 2005/0116216 | A1 | * | 6/2005 | Harle et al. | 257/14 |
| 2006/0086932 | A1 | * | 4/2006 | Kim et al. | 257/13 |
| 2007/0045655 | A1 | * | 3/2007 | Song et al. | 257/104 |
| 2007/0075307 | A1 | * | 4/2007 | Yoon et al. | 257/21 |

FOREIGN PATENT DOCUMENTS

JP        11-87773    *  3/1999

* cited by examiner

*Primary Examiner*—Ahmed Sefer
(74) *Attorney, Agent, or Firm*—McDermott Will & Emery LLP

(57) ABSTRACT

A nitride semiconductor light emitting device has high internal quantum efficiency but low operating voltage. The nitride semiconductor light emitting device includes an n-nitride semiconductor layer; an active layer of multi-quantum well structure formed on the n-nitride semiconductor layer, and having a plurality of quantum well layers and a plurality of quantum barrier layers; and a p-nitride semiconductor layer formed on the active layer. One of the quantum well layers adjacent to the n-nitride semiconductor layer has an energy band gap greater than that of another one of the quantum well layers adjacent to the p-nitride semiconductor layer.

7 Claims, 4 Drawing Sheets

NITRIDE SEMICONDUCTOR LIGHT EMITTING DEVICE

CLAIM OF PRIORITY

This application claims the benefit of Korean Patent Application No. 2005-100782 filed on Oct. 25, 2005, in the Korean Intellectual Property Office, the disclosure of which is incorporated herein by reference.

BACKGROUND OF THE INVENTION

1. Field of the Invention

The present invention relates to a nitride semiconductor light emitting device, and more particularly, to a high quality nitride semiconductor light emitting device having high internal quantum efficiency but low operating voltage.

2. Description of the Related Art

To date, Light Emitting Diodes (LEDs) or Laser Diodes (LDs) based on group III-V nitride semiconductor (hereinafter will be referred to as "nitride semiconductor" in short) are often used in light emitting devices for generating a blue or green wavelength of light, and applied as light sources of various products such as an electronic display board and lighting equipment. Such nitride semiconductor is made of a GaN based material having a composition of $In_xAl_yGa_{(1-x-y)}N$, where $0 \leq x \leq 1$, $0 \leq y \leq 1$ and $0 \leq x+y \leq 1$. To manufacture such a nitride semiconductor light emitting device, a nitride semiconductor light emitting structure is produced by sequentially forming an n-nitride semiconductor layer, an active layer and a p-nitride semiconductor layer on a growth substrate of for example sapphire.

An active layer in the light emitting structure may have a multi-quantum well structure. The active layer is composed of a plurality of quantum well and quantum barrier layers are stacked alternately on each other to form and thus a plurality of quantum wells exist at a small width in the active layer. With charge carriers (e.g., electrons and holes) easily captured in the quantum well structure, electron-hole recombination is more likely to take place in the active layer.

FIG. 1 is a diagram schematically illustrating an energy band structure of a conventional nitride semiconductor light emitting device. Particularly, FIG. 1 illustrates an energy band diagram about an active layer in a light emitting structure. Referring to FIG. 1, an active layer having a multi-quantum well structure is formed on an n-nitride semiconductor layer, and a p-nitride semiconductor layer is formed on the active layer. The active layer includes first to fifth quantum well layers 1st QW to 5th QW, which are arranged sequentially from the side adjacent to the n-nitride semiconductor layer, and quantum barrier layers of a relatively greater band gap alternating with the quantum well layers. The number of quantum well layers may be adjusted if necessary. Typically, a quantum well layer has In density set higher than that of a quantum barrier layer and thus its band gap is lower than that of the quantum barrier layer. The band gap (or the In density) of the quantum well layer is varied according to the wavelength of emitted light.

In a light emitting device having an active layer of such a quantum well structure, the band gaps of the quantum well layers are set to be substantially uniform. Then, the lattice constant of the active layer (particularly, the quantum well layer) shows a great difference from that of the n-nitride semiconductor layer. Such lattice mismatch causes a considerable amount of strain in the active layer. The strain in turn generates a piezoelectric field in the active layer, which increases the distance between electron wave function and hole wave function but lowers internal quantum efficiency. As a result, the overall brightness of the semiconductor light emitting device is lowered.

In addition, the strain in the active layer acts to degrade the uniformity of energy level in each quantum well. Accordingly, in application of high supply voltage, charge carriers are more likely to occupy higher energy level in the quantum well. Such band-filling phenomenon is a factor that creates blue shift, in which the wavelength of emitted light is shortened in application of high supply voltage, thereby causing the emitted light to have a wavelength beyond a designed range.

SUMMARY OF THE INVENTION

The present invention has been made to solve the foregoing problems of the prior art and therefore an object of certain embodiments of the present invention is to provide a high quality nitride semiconductor light emitting device which has high internal quantum efficiency and brightness and uniform energy level in a quantum well.

According to an aspect of the invention for realizing the object, the invention provides a nitride semiconductor light emitting device. The nitride semiconductor light emitting device includes an n-nitride semiconductor layer; an active layer of multi-quantum well structure formed on the n-nitride semiconductor layer, and having a plurality of quantum well layers and a plurality of quantum barrier layers; and a p-nitride semiconductor layer formed on the active layer. One of the quantum well layers adjacent to the n-nitride semiconductor layer has an energy band gap greater than that of another one of the quantum well layers adjacent to the p-nitride semiconductor layer. With the quantum well layer adjacent to the n-nitride semiconductor layer having a greater energy band gap, it is possible to reduce strain owing to the lattice mismatch between the n-nitride semiconductor layer and the active layer without having an effect on the wavelength of emitted light.

Such an asymmetric energy band gap structure of the active layer can be realized by change in In content. That is, the asymmetric energy band gap structure can be obtained by setting the quantum well layer adjacent to the n-nitride semiconductor layer to have a lower In content than the quantum well layer adjacent to the p-nitride semiconductor layer.

According to this invention, the active layer may include quantum well layers and quantum barrier layers alternate with each other, in which the quantum well layers have a composition of $In_xGa_{1-x}N$, where $0 \leq x \leq 1$, and the quantum barrier layers have a composition of $In_yGa_{1-y}N$, where $0 \leq y < 1$, $x > y$. Preferably, the quantum well layers have a composition of InGaN containing In, and the quantum barrier layers have a composition of GaN excluding In.

According to a preferred embodiment of the invention, each of the quantum well layers has a greater energy band gap with the quantum well layer being more adjacent to the n-nitride semiconductor layer. With the quantum will adjacent to the n-nitride semiconductor layer having a greater energy band gap, it is possible to reduce strain in the active layer. Such a band gap structure can be realized by the In content change of the quantum well layer. That is, by making the quantum well layer have a lower In content when more adjacent to the n-nitride semiconductor layer, the band gap of the quantum well layer can be made greater when the quantum well layer is more adjacent to the n-nitride semiconductor layer.

According to a preferred embodiment of the invention, the quantum well layer adjacent to the n-nitride semiconductor layer has a thickness smaller than that of the quantum well layer adjacent to the p-nitride semiconductor layer. More preferably, the quantum well layer has a smaller thickness when more adjacent to the n-nitride semiconductor layer. Preferably, the quantum well layer has a thickness ranging from 10 Å to 100 Å.

According to this invention, strain occurring in the active layer can be alleviated by adjusting the band gaps of the quantum well layers. This as a result raises internal quantum efficiency and luminance of the nitride semiconductor light emitting device. Furthermore, potential barrier lowered in the vicinity of the n-nitride semiconductor layer causes increase in electron injection efficiency without wavelength change of emitted light. This can obtain effects of improved luminance and decreased operating (forward) voltage. Furthermore, the quantum well layer having uniform quantum level can suppress creation of blue shift.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art.

Figure 2:
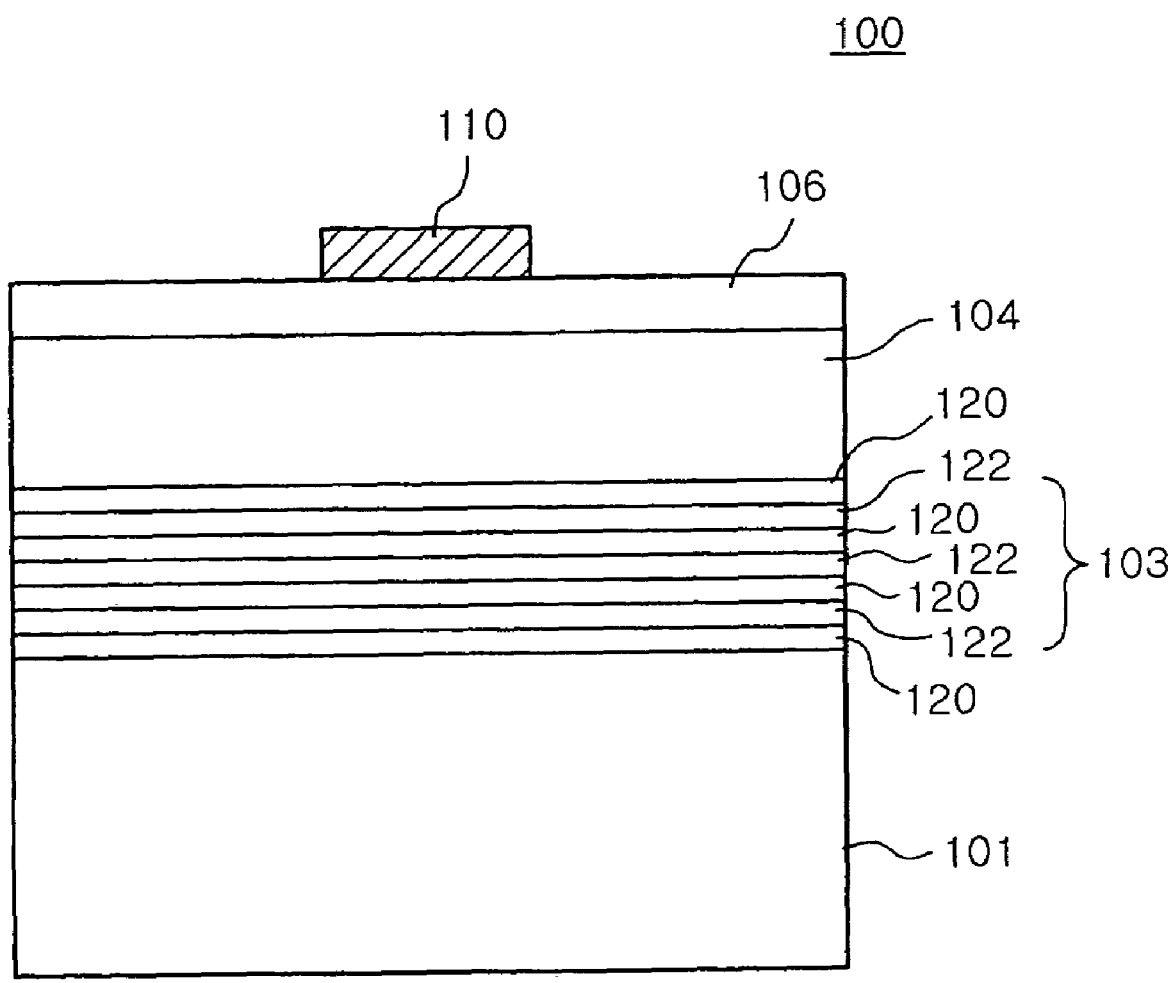
FIG. 2 is a cross-sectional view illustrating a nitride semiconductor light emitting device according to an embodiment of the invention.

FIG. 2 is a cross-sectional view illustrating a nitride semiconductor light emitting device 100 according to an embodiment of the invention. Referring to FIG. 2, the nitride semiconductor light emitting device 100 includes an n-nitride semiconductor layer 101, and includes an active layer 103 and a p-nitride semiconductor layer 104 sequentially stacked on the n-nitride layer 101. On the p-nitride semiconductor layer 104, formed are a p-contact layer 106 and a p-electrode 110. The light emitting device 100 may be of a lateral structure or a vertical structure. Accordingly, an n-electrode (not shown) may be arranged on a top portion of the light emitting device side by side with the p-electrode or on an underside portion of the light emitting device opposing the p-electrode 110. The n-nitride semiconductor layer 101 constitutes an n-type area while the p-nitride semiconductor layer 104 and the p-contact layer 106 constitute a p-type area.

The active layer 103 has a multi-quantum well structure. That is, the active layer 103 includes a plurality of quantum well layers 120 of a relatively smaller energy band gap and a plurality of quantum barrier layers 122 of a relatively greater energy band gap alternating with the quantum well layers. The stacking sequence of the quantum well layers and the quantum barrier layers of the active layer is not specifically limited. Stacking may start and terminate with quantum well layers or start with a quantum barrier layer and terminate with a quantum barrier layer. Otherwise, stacking may start and terminate with quantum barrier layers or start with a quantum barrier layer and terminate with a quantum well layer.

Each quantum well layer 120 has a quantum well capable of capture charge carriers such as electrons and holes. The electrons and holes captured in the quantum well recombine with each other, thereby emitting photons having energy (or wavelength according to energy) corresponding to band gap. Since electron's mobility is remarkably higher than hole's (electron's mobility is 5 to 10 times or more of hole's), light emission owing to electron-hole recombination takes place generally in an area adjacent to the p-nitride semiconductor layer 104. Accordingly, the wavelength of emitted light is determined by the energy band gap of a quantum well layer located adjacent to the p-nitride semiconductor layer 104.

Figure 1:
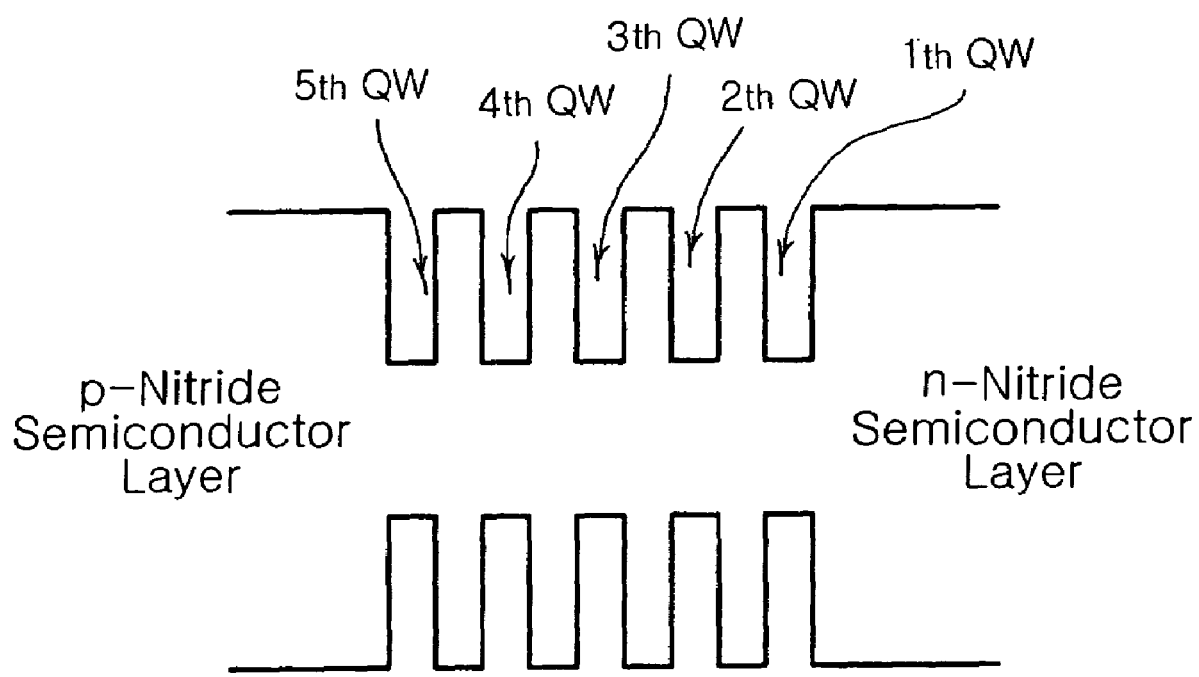
FIG. 1 is a diagram schematically illustrating an energy band structure of a conventional nitride semiconductor light emitting device.

According to the invention, a quantum well layer adjacent to the n-type area has a band gap greater than that of another quantum well layer adjacent to the p-type area. This reduces the lattice constant difference between the n-nitride semiconductor layer 101 and the active layer (particularly, the quantum well layer located adjacent to the n-nitride semiconductor layer 101) and thus decreases the lattice mismatch therebetween considerably. Accordingly, any strain occurring in the active layer 103 is reduced than in the prior art (see FIG. 1).

Even if the band gap of the quantum well layer adjacent to the n-type area (i.e., adjacent to the n-nitride semiconductor layer 101) is set relatively great, this rarely has an effect on the wavelength of emitted light. This is because most electron-hole recombination for light emission takes place in a region adjacent to the p-type area. With this, it is possible to restrain the strain in the active layer while having substantially no effect on the wavelength of emitted light. An example of the multi-quantum well structure of the active layer of the invention is schematically shown in FIG. 3.

Figure 3:
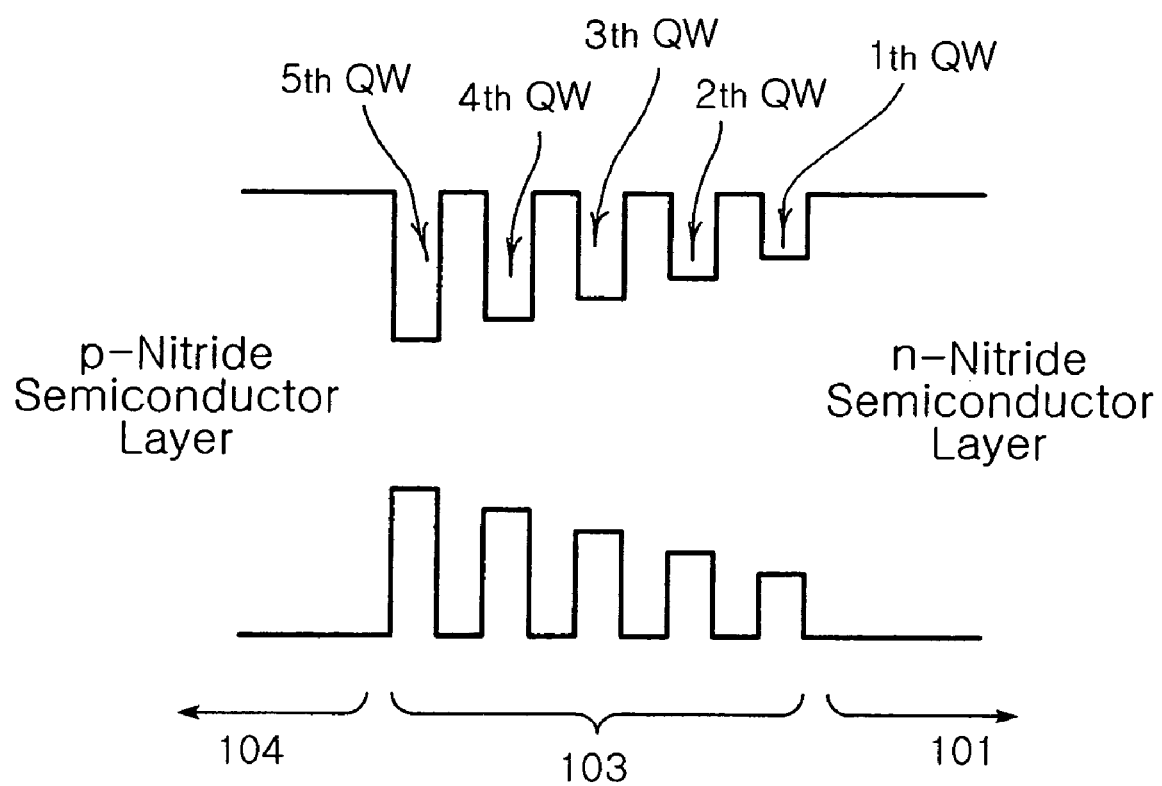
FIG. 3 is a diagram schematically illustrating an energy band structure of the nitride semiconductor light emitting device according to an embodiment of the invention.

FIG. 3 is a diagram schematically illustrating an energy band structure of the nitride semiconductor light emitting device according to an embodiment of the invention. FIG. 3 particularly shows an energy band diagram about an active layer in a light emitting structure. The active layer 103 interposed between an n-nitride semiconductor layer 101 and the p-nitride semiconductor layer 104 has an asymmetrical multi-quantum well structure.

Referring to FIG. 3, the active layer 103 includes first to fifth quantum well layers 1st QW (1th QW.), 2th QW. 3th QW, 4th QW and 5th QW, which are arranged sequentially from the side of the n-nitride semiconductor 101 to the side of the p-nitride semiconductor 104, and quantum barrier layers of a relatively great band gap alternating with the quantum well layers 1st QW (1th QW) to 5th QW. The multi-quantum well structure is realized by the quantum well and quantum barrier layers stacked on and alternating with each other. While five quantum wells are shown in the drawings, the number of the quantum wells (i.e., the number of the quantum well layers) may be smaller or greater than this.

As shown in FIG. 3, the first quantum well layer 1st QW located adjacent to the n-nitride semiconductor layer 101 has a greater band gap than the fifth quantum well layer 5th QW adjacent to the p-nitride semiconductor layer 104. The band gap of the quantum well layer 5th QW adjacent to the p-nitride semiconductor layer 104 is preset to emit a predetermined wavelength of light. This is because the electron-hole recombination for light emission takes place generally in the fifth quantum well layer 5th QW adjacent to the p-nitride semiconductor layer 104.

With the band gap of the quantum well layer 1st QW adjacent to the n-nitride semiconductor layer 101 set greater than that of the quantum well layer 5th QW adjacent to the p-nitride semiconductor layer, it is possible to decrease the lattice mismatch between the n-nitride semiconductor layer 101 and the quantum well layer adjacent thereto. This as a result reduces strain in the active layer originating from the lattice mismatch between the n-nitride semiconductor layer 101 and the active layer 103.

According to this embodiment, the band gap of the quantum well layer increases with the quantum well layer more adjacent to the n-nitride semiconductor layer 101 as shown in FIG. 3. With this, it is possible to restrain lattice defect or lattice mismatch from occurring at an early stage of growth of the active layer on the n-nitride semiconductor layer 101 and to suppress strain from occurring in the active layer completely grown. Such strain suppressed from occurring prevents a piezoelectric field and improves internal quantum efficiency, thereby increasing the luminance of the light emitting device.

The strain suppressed from occurring in the active layer 103 results in each quantum well having uniform energy level. This as a result alleviates band filling effect in which charge carriers fill ununiform energy levels in the quantum well when a high supply voltage is applied. Accordingly, it is possible to improve blue shift effect occurring in the application of a high supply voltage.

Furthermore, as shown in FIG. 3, with a relatively higher band gap given to quantum well layers relatively adjacent to the n-nitride semiconductor layer 101 (e.g., 1st QW and 2nd QW), electron injection efficiency is further enhanced. That is, the quantum well layers adjacent to the n-type area having lower quantum well levels lower the potential barrier of electrons injected from the n-type area. Accordingly, electrons are easily injected from the n-type area (n-nitride semiconductor layer) into the active layer, and as a result, the operating (forward) voltage is lowered also.

Figure 4:
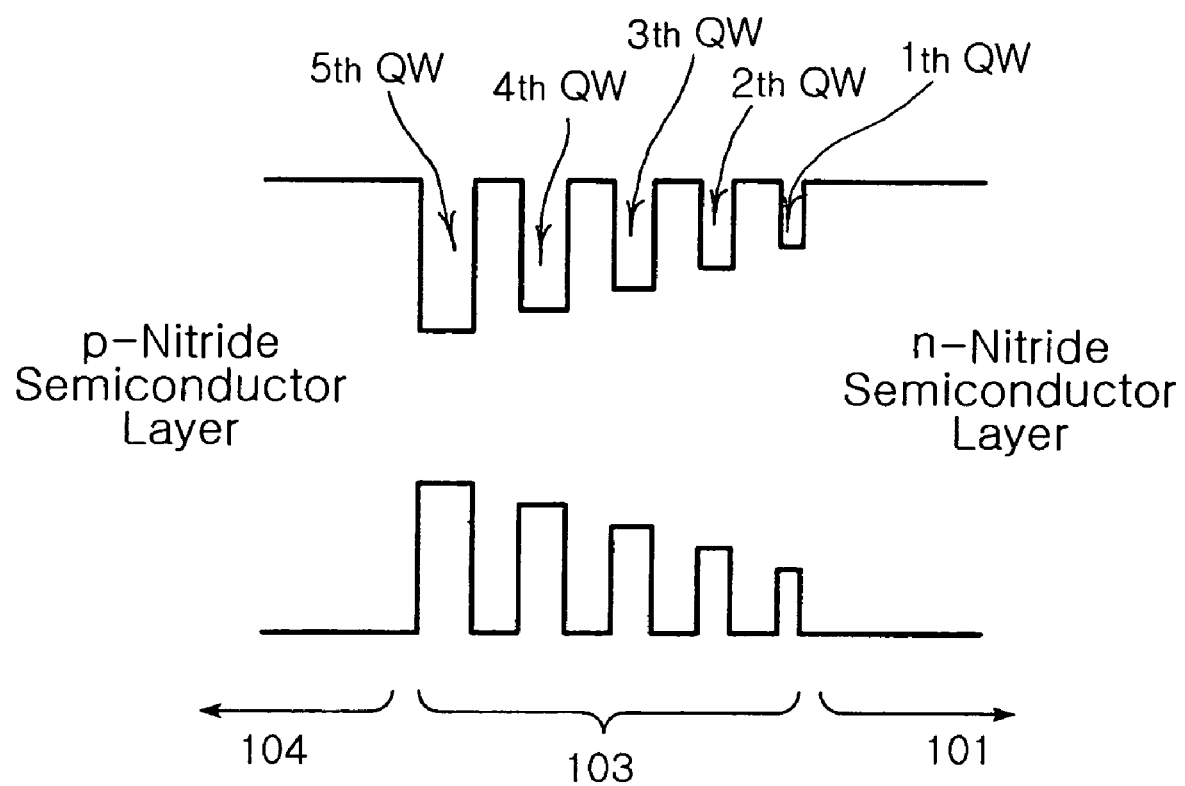
FIG. 4 is a diagram schematically illustrating an energy band structure of the nitride semiconductor light emitting device according to another embodiment of the invention.

The asymmetrical quantum well structure as shown in FIG. 4 can be designed as follows: First, the quantum well layer 5th QW adjacent to the p-nitride semiconductor layer 104 is set to have a predetermined band gap in order to produce a desired wavelength of light. Then, the band gaps of the remaining quantum well layers are designed to increase gradually with the quantum well layers being more adjacent to the n-nitride semiconductor layer 101.

The energy band gap structure of the active layer 103 designed as above can be varied according to change in In content. That is, the In content of the quantum well layer adjacent to the n-nitride semiconductor layer 101 can be set to be lower than that of the quantum well layer adjacent to the p-nitride semiconductor layer 104 in order to realize the afore-mentioned asymmetric energy band gap structure.

Describing it in more detail, the quantum well layer is formed with a composition of $In_xGa_{1-x}N$, where $0 \leq x \leq 1$, and the quantum barrier layer is formed with a composition of $In_yGa_{1-y}N$, where $0 \leq y < 1$, with In content lower than that of the quantum well layer. For example, the quantum well layer may be formed with a composition of InGaN containing In, and the quantum barrier layer may be formed with a composition of GaN which does not contain In. In addition, the In content of the quantum well layer 5th QW adjacent to the p-type area is set to be higher than that of the quantum well layer 1st QW adjacent to the n-type area. As a result, the quantum well layer 1st QW adjacent to the n-type area has a band gap relatively greater than that of the quantum well layer 5th QW adjacent to the p-type area. This is because $In_xGa_{1-x}N$ composition has a smaller band gap with In content increasing. While n- or p-type impurities (dopants) may be doped into the active layer 103, it is more preferable not to dope the active layer in order to improve crystallinity.

In particular, as shown in FIG. 3, the In contents of the $In_xGa_{1-x}N$ quantum well layers may be set to decrease gradually with the quantum well layers being more adjacent to the n-type area in order to increase the band gaps of the quantum well layers gradually with the quantum well layers being more adjacent to the n-type area. That is, the In contents of the $In_xGa_{1-x}N$ quantum well layers can be increased with the quantum well layers being more adjacent to the p-type area. Accordingly, quantum wells are increased with depth from the first quantum well layer 1st QW toward the fifth quantum well layer 5th QW. Such In content change in the quantum well layers can be easily realized by adjusting the flow rate of In source gas (e.g., trimethylindium (TMI)) fed during the growth of the quantum well layers.

FIG. 4 is a diagram schematically illustrating an energy band structure of the nitride semiconductor light emitting device according to another embodiment of the invention. In this embodiment, the thicknesses of the quantum well layers are not uniform but varied according to the distance from the n-type area. Like the first embodiment as described above, the quantum well layer 1st QW adjacent to the n-nitride semiconductor layer 101 has a lower In content and a greater band gap than the quantum well layer 5th QW adjacent to the p-nitride semiconductor layer 104. In addition, with a quantum well layer more adjacent to the n-type nitride semiconductor layer 101, the In content decreases but the band gap increases.

Referring to FIG. 4, the quantum well layer 1st QW adjacent to the n-type nitride semiconductor layer 101 has a thickness smaller than that of the quantum well layer 5th QW adjacent to the p-nitride semiconductor layer 104. With the quantum well layer adjacent to the n-nitride semiconductor layer 101 having a relatively small thickness, it is possible to suppress strain owing to the lattice constant difference between the active layer 103 and the n-nitride semiconductor layer 101. In particular, as the thickness of the quantum well layer decreases with the quantum well layer more adjacent to the n-nitride semiconductor layer 101, the strain owing to lattice constant in the active layer 103 is more reduced. Accordingly, an active layer produced has excellent crystallinity with improved internal quantum efficiency and luminance. The thickness of the quantum well layer is preferably in the range from 10 Å to 100 Å. A too large thickness of a quantum well layer may act against strain alleviation and output improvement.

According to certain embodiments of the present invention as set forth above, it is possible to suppress strain in an active layer, thereby improving internal quantum efficiency and luminance of a resultant light emitting device. Furthermore, as a potential barrier in the vicinity of an n-nitride semiconductor layer is dropped, electron injection efficiency can be raised without wavelength change in emitted light. This as a result can increase luminance while reducing operating (forward) voltage. Moreover, since quantum wells have uniform quantum level, it is possible to restrain blue shift.

While the present invention has been described with reference to the particular illustrative embodiments and the accompanying drawings, it is not to be limited thereto but will be defined by the appended claims. It is to be appreciated that those skilled in the art can substitute, change or modify the embodiments into various forms without departing from the scope and spirit of the present invention.

What is claimed is:

1. A nitride semiconductor light emitting device comprising:
an n-nitride semiconductor layer;
an active layer of multi-quantum well structure formed on the n-nitride semiconductor layer, and having three or more quantum well layers and a plurality of quantum barrier layers; and
a p-nitride semiconductor layer formed on the active layer,
wherein one of the three or more quantum well layers adjacent to the n-nitride semiconductor layer has an energy band gap greater than those of another one of the three or more quantum well layers adjacent to the p-nitride semiconductor layer, and one of the three or more of quantum well layers proximate to the n-nitride semiconductor layer has a smaller thickness than another one of the three or more quantum well layers less proximate to the n-nitride semiconductor layer.

2. The nitride semiconductor light emitting device according to claim 1, wherein one of the three or more quantum well layers adjacent to the n-nitride semiconductor layer has an In content lower than that of another one of the quantum well layers adjacent to the p-nitride semiconductor layer.

3. The nitride semiconductor light emitting device according to claim 1, wherein the three or more quantum well layers and the quantum barrier layers alternate with each other, the three or more quantum well layers having a composition of $In_xGa_{1-x}N$, where $0 \leq x \leq 1$, and the quantum barrier layers having a composition of $In_yGa_{1-y}N$, where $0 \leq y < 1$, $x > y$.

4. The nitride semiconductor light emitting device according to claim 1, wherein the three or more quantum well layers have a composition of InGaN, and the quantum barrier layers have a composition of GaN excluding In.

5. The nitride semiconductor light emitting device according to claim 1, wherein the three or more quantum well layers have a energy band gap increasing with increase of proximity to the n-nitride semiconductor layer.

6. The nitride semiconductor light emitting device according to claim 1, wherein the three or more quantum well layers have an In content decreasing with increase of proximity to the n-nitride semiconductor layer.

7. The nitride semiconductor light emitting device according to claim 1, wherein each of the three or more quantum well layers has a thickness ranging from 10 Å to 100 Å.

* * * * *